United States Patent [19]
Fletcher et al.

[11] Patent Number: 4,740,717
[45] Date of Patent: Apr. 26, 1988

[54] SWITCHING DEVICE WITH DYNAMIC HYSTERESIS

[75] Inventors: Thomas D. Fletcher; Yong-In Shin, both of Orem, Utah

[73] Assignee: North American Philips Corporation, Signetics Division, Sunnyvale, Calif.

[21] Appl. No.: 934,753

[22] Filed: Nov. 25, 1986

[51] Int. Cl.$^4$ .................. H03K 17/16; H03K 17/687; H03K 19/003; H03K 19/094
[52] U.S. Cl. .................................. 307/443; 307/451; 307/491; 307/572
[58] Field of Search .................... 307/270, 273, 200 B, 307/451, 469, 491, 501, 443, 572, 290

[56] References Cited

U.S. PATENT DOCUMENTS

| | | | |
|---|---|---|---|
| 4,507,570 | 3/1985 | Mahabadi et al. | 307/273 |
| 4,532,439 | 7/1985 | Koike | 307/450 |
| 4,609,834 | 9/1986 | Gal | 307/443 |

Primary Examiner—John Zazworsky
Attorney, Agent, or Firm—R. Meetin; J. Oisher; T. Briody

[57] ABSTRACT

A switching device (22) responsive to an input voltage $V_A$ is powered by low and high internal supply voltages $V_L$ and $V_H$. The device changes state as $V_A$-$V_L$ passes a threshold voltage $V_T$. After the device makes a desired change of state in response to rising $V_A$, a hysteresis circuit (24) temporarily decreases $V_T$ below that which would otherwise be present. Likewise, after the device makes a desired change of state in the opposite direction when $V_A$ is falling, the hysteresis circuit temporarily decreases $V_T$. In both cases, $V_T$ later automatically returns to its original value. This dynamic hysteresis prevents spikes in $V_L$ and $V_H$ from causing undesired changes in state.

20 Claims, 4 Drawing Sheets

SWITCHING DEVICE WITH DYNAMIC HYSTERESIS

FIELD OF USE

This invention relates to switching devices suitable for semiconductor applications.

BACKGROUND ART

Various problems arise when a fast semiconductor integrated circuit (IC) interacts with the outside world. One problem is that the voltages on the internal supply lines often "bounce" up and down. The bounce can cause the IC to operate improperly when it responds to an input signal having a slowly changing voltage. The problem normally becomes more serious as the IC speed increases.

In explanation of supply line bounce, FIG. 1 illustrates a portion of a digital IC 10 that receives largely constant external supply voltages $V_{HH}$ and $V_{LL}$ at respective externally accessible supply terminals (or pads) $T_H$ and $T_L$. $V_{HH}$ is greater than $V_{LL}$. IC 10 produces a circuit output voltage $V_O$ at an externally accessible output terminal $T_O$ in response to a circuit input voltage $V_I$ received at an externally accessible input terminal $T_I$. A capacitor $C_O$, which may be real or parasitic, is connected between terminal $T_O$ and the $V_{LL}$ supply.

The illustrated portion of IC 10 is a conventional inverting driver powered by high and low internal supply voltages $V_H$ and $V_L$ provided on lines connected respectively to terminals $T_H$ and $T_L$. Responsive to an internal input voltage $V_A$ supplied on a line connected to terminal $T_I$, the driver produces an internal output voltage $V_D$ on a line connected to terminal $T_O$. Parasitic inductances $L_L$, $L_H$, $L_I$, and $L_O$ are respectively associated with the lines carrying voltages $V_L$, $V_H$, $V_A$, and $V_D$.

The driver consists of an input inverter 12, an intermediate inverter 14, and an output inverter 16, each of which is progressively larger so as to provide progressively more current. Inverter 12 is formed with complementary input field-effect transistors (FET's) Q1$_N$ and Q1$_P$ whose gates receive voltage $V_A$ and whose interconnected drains provide an inverter output voltage $V_B$ logically inverse to voltage $V_A$. Inverter 14, which is typically configured the same as inverter 12, generates a voltage $V_C$ inverse to voltage $V_B$. Inverter 16 consists of complementary output FET's Q2$_N$ and Q2$_P$ whose gates receive voltage $V_C$ and whose interconnected drains provide voltage $V_D$ as the inverse of voltage $V_C$. FET's Q1$_N$ and Q2$_N$ are N-channel devices whose sources are connected to the $V_L$ supply line. FET's Q1$_P$ and Q2$_P$ are P-channel transistors having their sources tied to the $V_H$ supply line.

Returning to inverter 12, it changes state as the voltage difference $V_A$-$V_L$ passes an inverter threshold voltage $V_T$. Threshold $V_T$ is at a nominal value $V_S$ when internal supply voltages $V_L$ and $V_H$ are respectively at (or very close to) $V_{LL}$ and $V_{HH}$. Accordingly, inverter 12 switches from a high logic state to a low logic state as voltage $V_A$ rises above $V_{LL}$+$V_S$. This is manifested in voltage $V_B$ which goes from a high voltage level close to $V_{HH}$ to a low voltage level close to $V_{LL}$. When $V_A$ later drops below $V_{LL}$+$V_S$, inverter 12 switches from its low logic state to its high logic state. $V_B$ then rises from $V_{LL}$ back up to $V_{HH}$.

Consider what happens if input $V_I$ changes very slowly. With reference to FIG. 2 which roughly shows how certain voltages vary with time for IC 10, assume that $V_I$ is initially low. Also assume that $V_L$ and $V_H$ are respectively at $V_{LL}$ and $V_{HH}$. $V_A$ is then low, causing $V_B$ to be at $V_{HH}$. $V_C$ is low so that FET Q2$_N$ is turned off and FET Q2$_P$ is turned on. $V_D$ and $V_O$ are both at $V_{HH}$. Capacitor $C_O$ is charged to a high level.

As $V_I$ rises slowly, $V_A$ tracks $V_I$ closely. Inductance $L_I$ does not have any significant effect on $V_A$. At a time $t_1$, $V_A$ starts to go above $V_{LL}$+$V_S$. This causes $V_B$ to drop rapidly to $V_{LL}$. $V_C$ goes high to turn FET Q2$_N$ on and FET Q2$_P$ off. $V_D$ drops rapidly to $V_{LL}$. At a time $t_2$ depending on the transmission delays through inverters 14 and 16, capacitor $C_O$ starts discharging to the $V_{LL}$ supply by way of a path through elements $L_O$, Q2$_N$, and $L_L$ to pull $V_O$ rapidly down to $V_{LL}$.

The current flowing through this path varies with time in a non-linear manner. Since the voltage across an inductor is the inductance times the time rate of change of current flowing through the inductor, a positive voltage builds up across inductance $L_L$, reaching a maximum at a time $t_3$. A positive (or upward going) spike in $V_L$ thereby occurs at $t_3$ as shown in FIG. 2. The $V_L$ spike at $t_3$ is the "first" spike in a set of timewise contiguous pairs of alternating spikes that die out quickly, of which only the first pair of alternating spikes are actually shown in FIG. 2. The same applies to the further supply line spikes discussed below for FIG. 2 and to the supply line spikes illustrated in the other time diagrams herein.

The $V_L$ spike at $t_3$ is often so high that $V_A$-$V_L$ temporarily drops below threshold $V_T$. This is true even though the attendant reduction of the difference between $V_H$ and $V_L$ during the positive $V_L$ spike reduces $V_T$ somewhat. See shaded area 18 in FIG. 2. (Note that the comparison of $V_L$ to $V_A$-$V_T$ shown in the various time diagrams herein is equivalent to the comparison of $V_A$-$V_L$ to $V_T$ which is more difficult to illustrate graphically.) Inverter 12 then makes a pair of rapid changes in logic state at approximately a time $t_4$, causing $V_B$ to spike upwards. In turn, the $V_B$ spike causes a positive $V_O$ spike to occur at a time $t_5$. Even if the $C_O$ discharge current flowing through FET Q2$_N$ in output inverter 16 were not sufficient in itself to cause the $V_O$ spike, it could be produced as the result of several such output inverters acting in unison in IC 10.

The rapid charging and discharging of capacitor $C_O$ that occur with the $V_O$ spike produce a negative (or downward going) $V_H$ spike followed by another positive $V_L$ spike. In the example shown in FIG. 2, neither of the further spikes is sufficient to cause $V_A$-$V_L$ to fall below $V_T$. However, if $V_I$ were rising slower than indicated, the further supply line bounce could cause inverter 12 to make additional undesired transitions, thereby resulting in further $V_O$ spiking.

The same situation arises if $V_I$ drops slowly, except that the polarities and supply lines are reversed. The first spike is a negative $V_H$ spike that results from the rapid charging of capacitor $C_O$ by way of a path through elements $L_H$, Q2$_P$, and $L_O$.

The $V_O$ spikes and the corresponding spikes in $V_B$, $V_C$, and $V_D$ can be disastrous. They can cause a circuit (such as a flip-flop) responsive to $V_O$, $V_B$, $V_C$, or $V_D$ to be set in a wrong state.

To overcome the bounce problem, one might consider replacing inverter 12 with a device (such as a Schmitt trigger) having a pair of separate static voltage thresholds. While static hysteresis might be useful in certain applications, it is not effective if the two thresholds must lie within a narrow voltage range. A solution that entails a single static threshold is desirable.

GENERAL DISCLOSURE OF THE INVENTION

In accordance with the invention, a switching device utilizes dynamic hysteresis to prevent internal supply line voltage bounce from causing unwanted changes in state. The present hysteresis is termed "dynamic" because a change in device threshold voltage triggered by a change in logic state occurs only for a prescribed period of time. When that period expires, the threshold voltage automatically returns to its original value. The device therefore has only one static threshold. This makes the invention especially useful in a high-speed IC having a narrow threshold range in which the input voltage must switch. The invention also avoids the additional propogation delays that normally occur with static hysteresis.

More particularly, the present device is incorporated in an electronic circuit in which a low supply voltage $V_L$ and a high supply voltage $V_H$ are provided to power the device. In response to an input voltage $V_A$, the device changes state as $V_A-V_L$ passes a threshold voltage $V_T$. With threshold $V_T$ substantially at a value $V_S$ and with voltages $V_L$ and $V_H$ substantially at respective values $V_{LL}$ and $V_{HH}$, the device switches from a first state to a second state as $V_A$ rises above $V_{LL}+V_S$ and from the second state to the first state as $V_A$ drops below $V_{LL}+V_S$.

The device includes a dynamic hysteresis circuit that, after $V_A$ rises above $V_{LL}+V_S$, temporarily decreases $V_T$ below that which would otherwise be present and/or, after $V_A$ drops below $V_{LL}+V_S$, temporarily increases $V_T$ above what would otherwise be present. $V_T$ normally returns to $V_S$ before $V_A$ starts moving in the direction opposite to that in which it was moving when $V_T$ changed.

The device typically contains a pair of input N-channel and P-channel FET's having gates responsive to voltage $V_A$, sources respectively coupled to the lines carrying voltages $V_L$ and $V_H$, and drains coupled together to provide an output voltage $V_B$ inverse to voltage $V_A$. If the dynamic hysteresis circuit performs both of the above operations on threshold $V_T$, the hysteresis circuit is preferably formed with a control circuit and a pair of further N-channel and P-channel FET's having gates responsive to signals from the control circuit, sources respectively coupled to the $V_L$ and $V_H$ lines, and drains coupled to the drains of the input FET's.

The control circuit causes the further N-channel FET to turn on temporarily in response to voltage $V_B$ going from a high level to a low level. This temporarily increases the width of the pertinent conducting N-channel area in the device so as to reduce $V_T$ until the further N-channel FET turns off. Likewise, the control circuit causes the further P-channel FET to turn on temporarily in response to voltage $V_B$ going from its low level to its high level. The width of the pertinent conducting P-channel area in the device thereby increases to raise $V_T$ briefly.

The temporary change in $V_T$ provides a clearance that prevents the present device from making a pair of rapid changes of state as the result of internal supply line bounce when $V_A$ is changing slowly. This avoids output voltage spikes.

Figure 1:
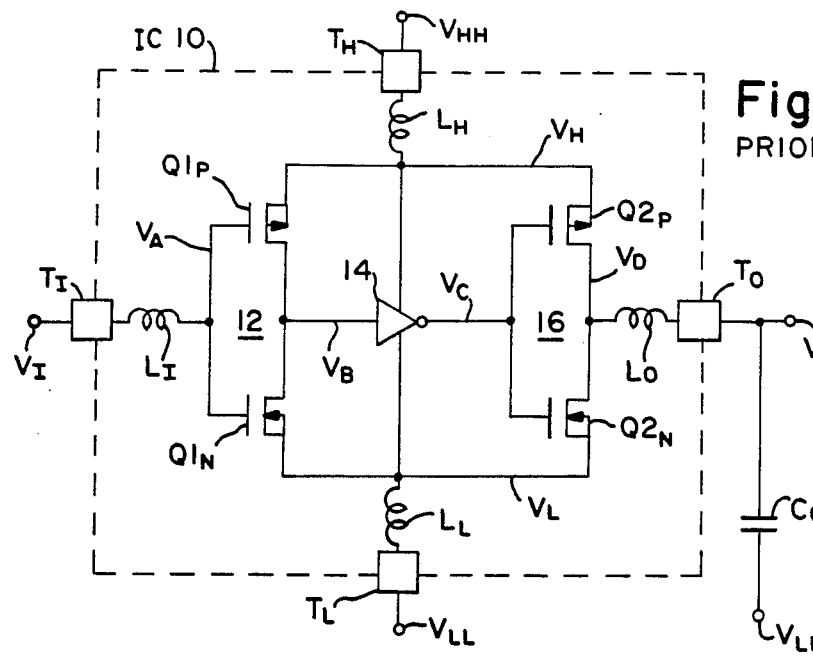
FIG. 1 is a circuit diagram for a portion of a digital IC utilizing a conventional input inverter.

Like reference symbols are employed in the drawings and in the description of the preferred embodiments to represent the same or very similar item or items. In the drawings, each N-channel FET has an arrow pointing towards its channel. Each P-channel FET has an arrow pointing away from its channel. All of the FET's shown in the drawings are enhancement-mode insulated-gate devices.

DESCRIPTION OF THE PREFERRED EMBODIMENTS

Figure 3:
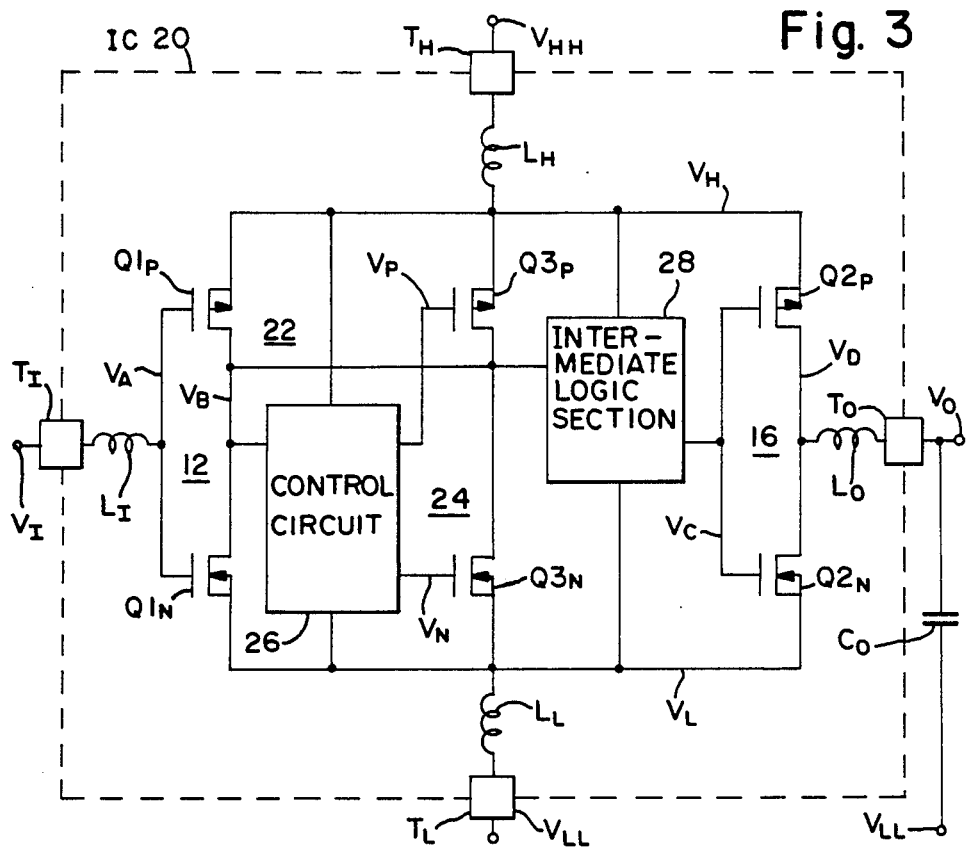
FIG. 3 is a circuit diagram for a portion of a digital IC that utilizes an input inverting device having dynamic hysteresis according to the invention.

Referring to the drawings, FIG. 3 illustrates a portion of a digital IC 20 in which a very fast logic circuit powered by high and low internal supply voltages $V_H$ and $V_L$ operates on input voltage $V_A$ and possibly on other input voltages (not shown) to produce output voltage $V_D$. The logic circuit contains an input inverting device 22 that produces voltage $V_B$ as the logical inverse of voltage $V_A$. Device 22 is formed with input inverter 12 consisting of FET's $Q1_N$ and $Q1_P$ arranged as described above and a circuit 24 that provides dynamic hysteresis for the threshold voltage $V_T$ of device 22.

Dynamic hysteresis circuit 24 consists of a control circuit 26 powered by supply voltages $V_H$ and $V_L$, an N-channel FET $Q3_N$, and a P-channel FET $Q3_P$. In response to voltage $V_B$, control circuit 26 supplies threshold-control voltages $V_N$ and $V_P$ to the respective gates of FET's $Q3_N$ and $Q3_P$. Their sources are respectively connected to the $V_L$ and $V_H$ supply lines, while their drains are connected to the drains of FET's $Q1_N$ and $Q1_P$ to produce voltage $V_B$. FET $Q3_N$ is therefore "in parallel" with FET $Q1_N$. Likewise, FET's $Q3_P$ and $Q1_P$ are in parallel.

The threshold voltage for an inverter formed with complementary FET's depends on the ratio $R_{P/N}$ of the P-channel width to the N-channel width (at constant channel length). This means the widths of the channel areas that are conducting at the threshold point. The threshold voltage increases when $R_{P/N}$ increases and vice versa.

FET's $Q3_N$ and $Q3_P$ are normally off or at so low conductive levels as to be effectively off. Accordingly, the quiesent value of $R_{P/N}$ for device 22 is simply the $Q1_P$ channel width divided by the $Q1_N$ channel width since FET's $Q1_N$ and $Q1_P$ are both conducting at the threshold point, one in the midst of turning on and the other in the midst of turning off. If FET $Q3_N$ is on but FET $Q3_P$ is off, the N-channel width for device 22 increases since FET's $Q3_N$ and $Q1_N$ are in parallel. $R_{P/N}$ for device 22 is therefore less than its quiescent value. In like manner, $R_{P/N}$ for device 22 is greater than the quiescent value when FET $Q3_P$ is on but FET $Q3_N$ is off.

With the foregoing in mind, device 22 operates as follows. FET's $Q3_N$ and $Q3_P$ are initially off. Supply voltages $V_L$ and $V_H$ are initially at (or very near) respective substantially constant levels $V_{LL}$ and $V_{HH}$. Under these conditions, threshold $V_T$ is at quiescent value $V_S$ determined by the quiescent $R_{P/N}$ of device 22. When $V_A-V_L$ passes $V_T$, device 22 changes state.

If $V_A$ rises above $V_{LL}+V_S$, FET $Q1_N$ turns on and FET $Q1_P$ turns off. Device 22 as manifested by the conductive conditions of FET's $Q1_N$ and $Q1_P$ switches from a high logic state to a low logic state, causing voltage $V_B$ to go from a high level near $V_{HH}$ to a low level near $V_{LL}$. Responsive to this change in voltage $V_B$, control circuit 26 temporarily raises $V_N$ enough to turn FET $Q3_N$ on for a brief period. FET $Q3_P$ remains off. $R_{P/N}$ drops below its quiescent level. This reduces $V_T$ until circuit 26 reduces $V_N$ sufficiently to turn FET $Q3_N$ back off.

Largely the reverse occurs when $V_A$ drops below $V_{LL}+V_S$. FET $Q1_N$ turns off and FET $Q1_P$ turns on, causing device 22 to switch from its low logic state to its high logic state. $V_B$ goes from $V_{LL}$ up to $V_{HH}$. In response to this $V_B$ change, circuit 26 temporarily provides $V_P$ at a sufficiently low voltage to turn FET $Q3_P$ on for a short time. FET $Q3_N$ stays off. Consequently, $R_{P/N}$ rises above its quiescent value so as to increase $V_T$. When circuit 26 subsequently raises $V_P$ to turn off FET $Q3_P$, $V_T$ drops back down.

The logic circuit in IC 20 also contains an intermediate logic section 28 and output inverter 16. Logic section 28 may perform any of a number of logical functions such as inversion, ANDing, and ORing. Section 28 might also be a non-inverting buffer or simply a direct connection. Depending on how section 28 is configured, it operates on voltage $V_B$ and possibly on other input voltages (not shown) to produce voltage $V_C$ at a value that is logically the same as or inverse to voltage $V_B$. Inverter 16 consists of FET's $Q2_N$ and $Q2_P$ arranged as described above to produce voltage $V_D$ as the inverse of voltage $V_C$.

Circuit input voltage $V_I$ and external supply voltages $V_{LL}$ and $V_{HH}$ are supplied respectively to externally accessible terminals $T_I$, $T_L$, and $T_H$ which are interconnected with the logic circuit via parasitic inductances $L_I$, $L_L$, and $L_H$ in IC 20 in the same way that these elements are interconnected with the inverting driver in IC 10. The same comments apply to parasitic inductance $L_O$, capacitance $C_O$, and externally accessible output terminal $T_O$ at which circuit output voltage $V_O$ is provided in IC 20.

Figure 4A:
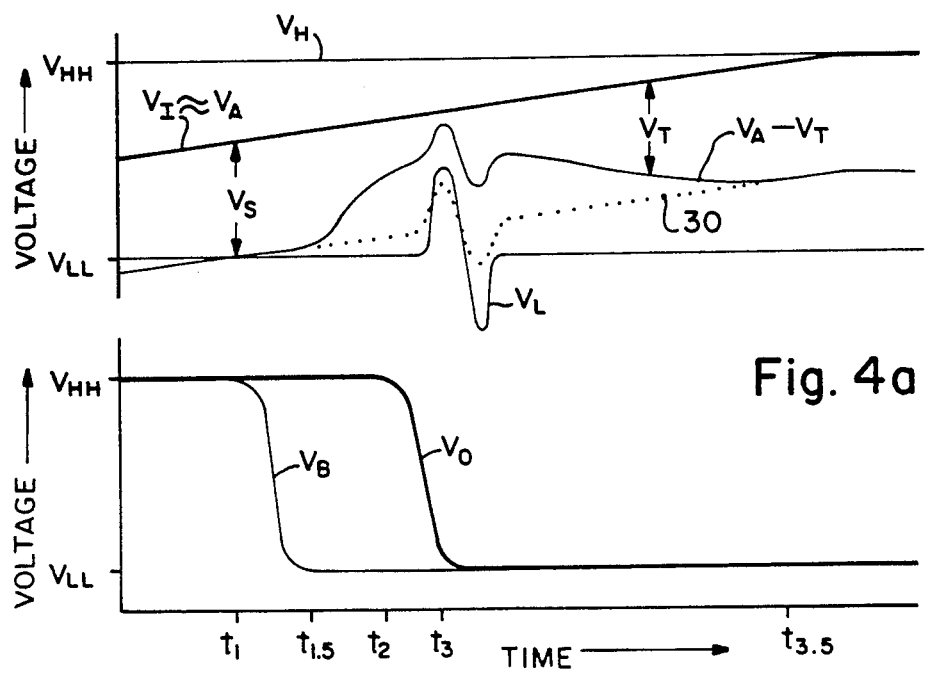
FIGS. 4a and 4b are two pairs of graphs for various voltages as a function of time for the IC of FIG. 3.
Figure 4B:
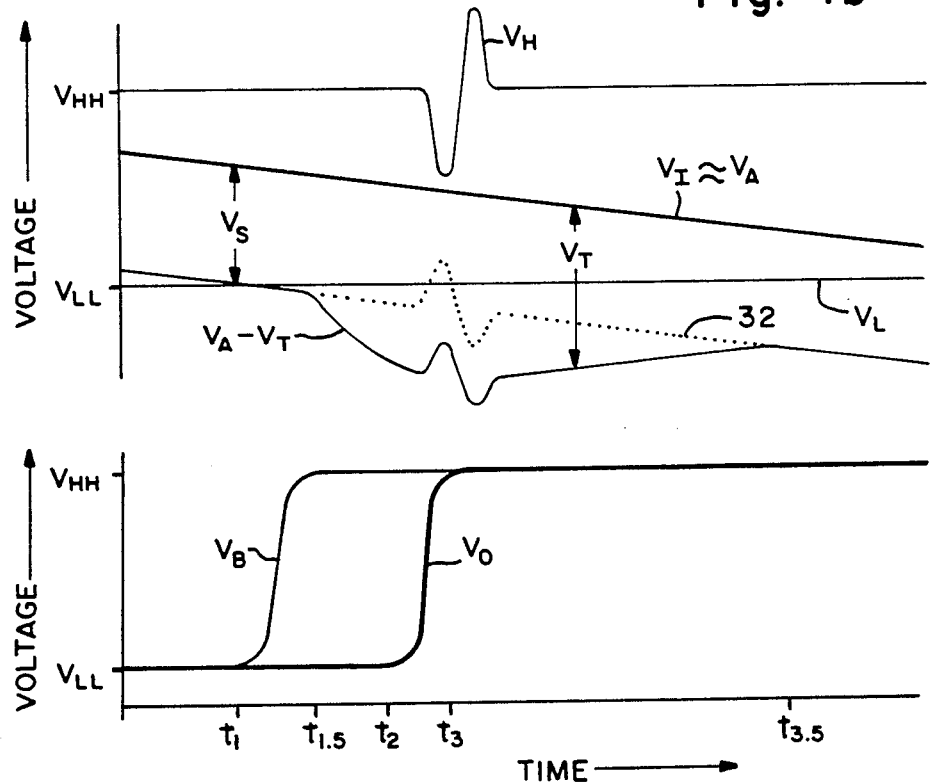

Now, look at what happens if voltage $V_I$ is changing slowly when internal supply line voltage bounce arises in the manner described above. Assume (for example) that section 28 provides a voltage inversion so that $V_C$ is the inverse of $V_B$. FIG. 4a is a pair of simplified diagrams illustrating voltage variation as a function of time for IC 20 for the case in which $V_I$ rises slowly. FIG. 4b is a corresponding pair of simplified time diagrams for the situation in which $V_I$ falls slowly. In both FIGS. 4a and 4b, $V_L$ is initially at $V_{LL}$ while $V_H$ is initially at $V_{HH}$. Threshold $V_T$ thus starts at $V_S$.

Figure 2:
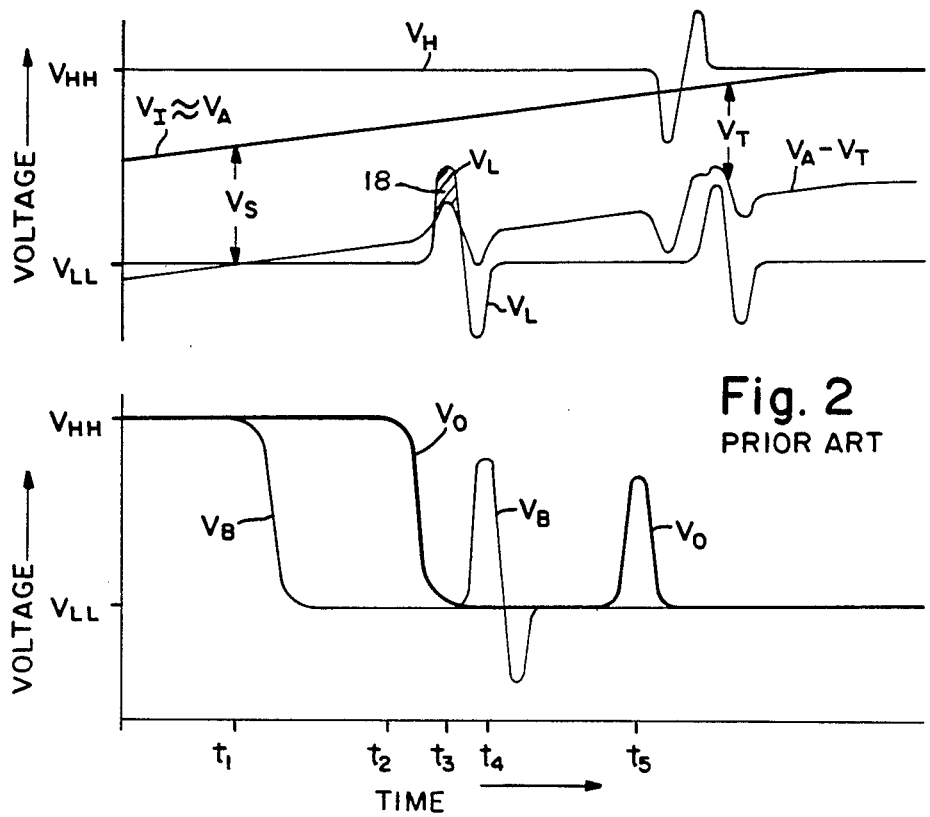
FIG. 2 is a pair of graphs for various voltages as a function of time for the IC of FIG. 1.

First consider FIG. 4a which is analagous to FIG. 2. $V_I$, $V_A$, $V_B$, and $V_O$ are initially at the values given above for FIG. 2. Capacitor $C_O$ is charged to a high level. As $V_I$ rises, $V_A$ follows closely. Inductance $L_I$ again has no significant effect. When $V_A$ passes $V_{LL}+V_S$ at time $t_1$, $V_B$ drops rapidly to $V_{LL}$. In response, hysteresis circuit 24 reduces $V_T$ starting at a time $t_{1.5}$. The difference between dotted line 30 and the solid line representing $V_A-V_T$ in FIG. 4a indicates the amount of reduction in $V_T$.

Capacitor $C_O$ starts discharging at time $t_2$. This produces a positive $V_L$ spike at time $t_3$ according to the mechanism described above for IC 10. The attendant reduction of the difference between $V_H$ and $V_L$ at $t_3$ does result in a further $V_T$ reduction beyond that already caused by circuit 24. However, due solely to the $V_T$ reduction produced by circuit 24, $V_A-V_L$ stays above $V_T$ during the positive $V_L$ spike. Capacitor $C_O$ thereby remains discharged so as to substantially inhibit any further internal supply line voltage bounce. Accordingly, no spikes occur in $V_B$, $V_C$, $V_D$, and $V_O$.

At a later time $t_{3.5}$, $V_T$ automatically returns to $V_S$. The circuit timing parameters and device values are preferably chosen in such a manner that $V_t$ goes back to $V_S$ before $V_I$ and $V_A$ start to drop in subsequent switching operation.

The falling $V_I$ situation of FIG. 4b is essentially the complement of that of FIG. 4a. In FIG. 4b, hysteresis circuit 24 increases $V_T$ between $t_{1.5}$ and $t_{3.5}$. The amount of $V_T$ increase is indicated by the difference between dotted line 32 and the solid line labeled $V_A-V_T$. As the result of the $V_T$ increase, $V_A-V_L$ remains below $V_T$ during the negative $V_H$ spike to prevent further spiking.

Alternatively, section 28 might generate $V_C$ at the same logical value as $V_B$. If $V_I$ rises slowly, the first supply line spiking occurs on the $V_H$ line as a negative spike followed immediately by a positive spike. Circuit 24 decreases $V_T$ to prevent $V_A-V_L$ from dropping below $V_T$ during the positive $V_H$ spike—i.e., the second spike in the pair of alternating $V_H$ spikes. The same applies when $V_I$ drops slowly except that the polarities and supply lines are reversed. Since the magnitude of the second spike in each pair of alternating internal supply line spikes is normally slightly less than the magnitude of the first spike, the situation in which $V_C$ and $V_B$ are logically the same is not as critical as when $V_C$ is the inverse of $V_B$.

Figure 5:
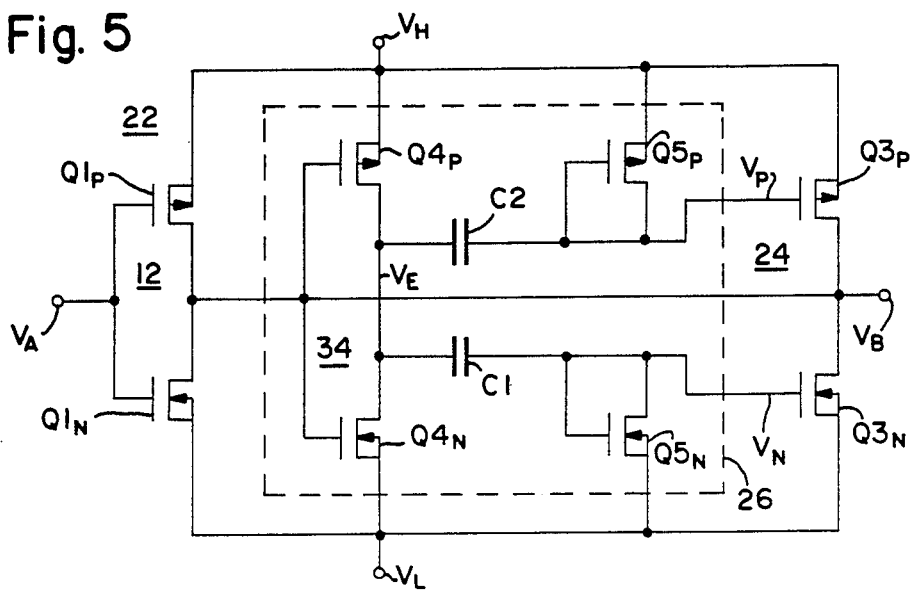
FIGS. 5 and 6 are circuit diagrams for specific embodiments of the input inverting device in FIG. 3.

Turning to FIG. 5, it depicts a specific embodiment for control circuit 26 in device 22. Circuit 26 here consists of complementary charge-supply FET's $Q4_N$ and $Q4_P$, capacitors C1 and C2, and complementary discharge FET's $Q5_N$ and $Q5_P$ connected as shown in FIG. 5. FET's $Q4_N$ and $Q4_P$ are arranged as an inverter 34 with their drains connected together to provide a voltage $V_E$ inverse to voltage $V_B$ supplied to their gates.

Circuit 26 in FIG. 5 operates in the following way. When $V_B$ drops from $V_{HH}$ to $V_{LL}$, FET $Q4_N$ turns off and FET $Q4_P$ turns on. Current from the $V_H$ line flows through FET $Q4_P$ to capacitors C1 and C2. Capacitor C1 provides positive charge to the $Q3_N$ gate for a short period of time. During this period, charge also flows to the $V_L$ line by way of a path through FET $Q5_N$ which turns on. A competition thus exists between the charging of the $Q3_N$ gate by capacitor C1 and the discharging of the $Q3_N$ gate through FET $Q5_N$. With appropriate selection for the transistor/capacitor sizes, the average charge rate during the charging period exceeds the average discharge rate by an amount sufficiently great that voltage $V_N$ rises enough to turn FET $Q3_N$ on. Shortly afterwards, the charge on the $Q3_N$ gate dissipates sufficiently through FET $Q5_N$ to cause FET $Q3_N$ to turn back off. When $V_B$ returns to $V_{HH}$ at a later time, elements $Q4_N$, C2, and $Q5_P$ function in a complementary manner to enable FET $Q3_P$ to turn on briefly.

Figure 6:
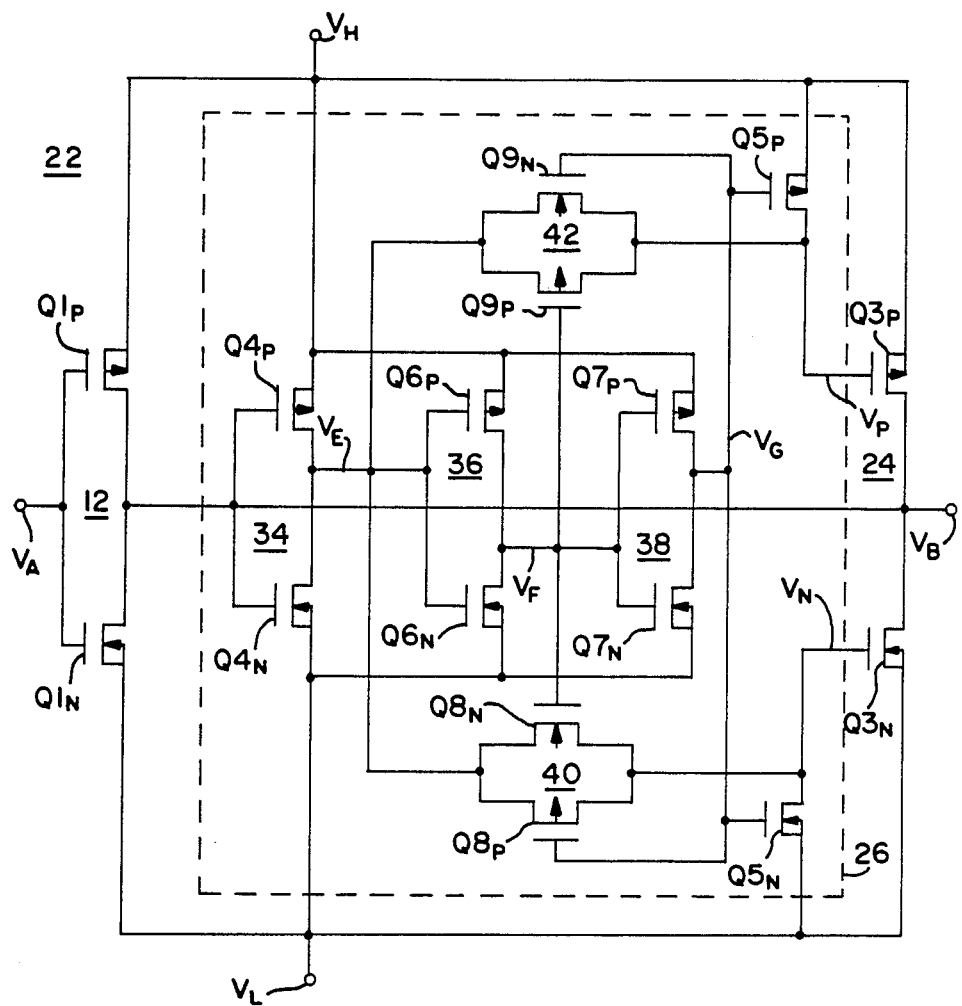

FIG. 6 shows a preferred embodiment for control circuit 26. In this case, circuit 26 consists of inverter 34, an inverter 36 that inverts voltage $V_E$ to produce a voltage $V_F$, an inverter 38 that inverts voltage $V_F$ to produce a voltage $V_G$, transmission gates 40 and 42, and discharge FET's $Q5_N$ and $Q5_P$ whose gates receive voltage $V_G$ here. FET $Q5_N$ is source-drain connected between the $V_L$ line and the $Q3_N$ gate. FET $Q5_P$ is similarly source-drain connected between the $V_H$ line and the $Q3_P$ gate.

Inverter 36 consists of complementary FET's $Q6_N$ and $Q6_P$ arranged in the conventional manner shown. Similarly, inverter 38 consists of FET's $Q7_P$ and $Q7_P$ connected conventionally. Gate 40 is formed with complementary FET's $Q8_N$ and $Q8_P$ whose gates respectively receive voltages $V_F$ and $V_G$. FET's $Q8_N$ and $Q8_P$ have interconnected first source/drain elements connected to the $Q4_N$ and $Q4_P$ drains and interconnected second source/drain elements connected to the $Q3_N$ gate. Gate 42 consists of complementary FET's $Q9_N$ and $Q9_P$ arranged with regard to the $Q3_P$ gate in a manner that is complementary to the arrangement of gate 40 with respect to the $Q3_N$ gate.

Circuit 26 in FIG. 6 operates as follows. Assume that $V_B$ is initially at $V_{HH}$ so that FET $Q4_N$ is on and FET $Q4_P$ is off. $V_F$ is likewise at $V_{HH}$. $V_E$ and $V_G$ are both at $V_{LL}$. FET $Q8_N$ is on, thereby setting $V_N$ at $V_{LL}$. FET's $Q3_N$, $Q5_N$, and $Q8_P$ are all off. When $V_B$ drops to $V_{LL}$, FET $Q4_N$ turns off and FET $Q4_P$ turns on. $V_E$ rises to $V_{HH}$. During an initial part of the time needed for inverter 36 to drop $V_F$ down to $V_{LL}$, positive charge from the $V_H$ line flows through FET's $Q4_P$ and $Q8_N$ to the $Q3_N$ gate. $V_N$ increases, enabling FET $Q8_P$ to turn on. Although FET $Q8_N$ gradually turns off, positive charge from the $V_H$ line now flows through FET's $Q4_P$ and $Q8_P$ to the $Q3_N$ gate to raise $V_N$ further. This continues for the entire time needed for inverter 36 to raise $V_G$ up to $V_{HH}$. At some point during the charging of the $Q3_N$ gate, FET $Q3_N$ turns on.

When inverter 38 finally switches, FET $Q8_P$ turns off to stop the charging of the $Q3_N$ gate. At this point, FET $Q5_N$ turns on. It opens a path to the $V_L$ line for discharging the $Q3_N$ gate, causing FET $Q3_N$ to turn off. Inverters 36 and 38 and FET's $Q4_N$, $Q9_N$, $Q9_P$, and $Q5_P$ operate in a similar, complementary manner to enable FET $Q3_P$ to turn on briefly when $V_B$ later returns to $V_{HH}$.

If the transmission delay of inverter 36 or 38 is too small to allow enough time to charge the $Q3_N$ gate and/or the $Q3_P$ gate, a delay element can be placed in series with inverter 36 or 38. The delay element might, for example, consist of a pair of inverters in series.

For the embodiment of FIG. 6, $V_{LL}$ and $V_{HH}$ preferably are 0 volt (ground) and 5 volts. FET's $Q1_N$, $Q1_P$, $Q3_N$, $Q3_P$, $Q4_N$, $Q4_P$, $Q5_N$, $Q5_P$, $Q6_N/Q7_N$, $Q6_P/Q7_P$, $Q8_N/Q9_N$, and $Q8_P/Q9_P$ have respective channel widths of 100, 270, 50, 100, 20, 50, 1, 5, 5, 10, 10, and 25 microns. The channel length for all of these FET's is preferably 1 micron except for FET $Q5_N$ whose channel length is 5 microns.

In some situations, the values at which $V_A$ is provided from an IC preceding IC 20 may not be appropriate for driving FET's $Q1_N$ and $Q1_P$ directly with $V_A$ so as to achieve a desired quiescent ($V_S$) value for $V_T$. Such cases can be handled by inserting a non-inverting buffer in the line leading to the gate of one of FET's $Q1_N$ and $Q1_P$. The buffer might, for example, consist of a pair of inverters in series. Nonetheless, the gates of FET's $Q1_N$ and $Q1_P$ are still responsive to $V_A$. Such an arrangement does not have any particularly significant effect on the dynamic hysteresis.

While the invention has been described with reference to particular embodiments, this description is solely for the purpose of illustration and is not to be construed as limiting the scope of the invention claimed below. For example, junction FET's could be used instead of insulated-gate FET's. Certain of the enhancement-mode FET's could be replaced with depletion-mode FET's. If dynamic hysteresis is needed only when input $V_I$ rises, FET $Q3_P$ and the portions of circuit 26 not used with FET $Q3_N$ (for example, FET's $Q5_P$, $Q9_N$, and $Q9_P$ in FIG. 6) could be deleted. The converse applies if dynamic hysteresis is needed only when $V_I$ falls.

Furthermore, threshold $V_T$ was defined with respect to low supply voltage $V_L$ merely because this is the normal convention. $V_T$ could as well have been defined with reference to high supply voltage $V_H$ without changing the design, physical operation, or effect of the invention. The only difference is that the polarities relating to $V_T$ would generally have to be reversed in the operational explanation. Thus, various modifications, changes, and applications may be made by those skilled in the art without departing from the true scope and spirit of the invention as defined by the appended claims.

We claim:

1. An electronic circuit in which a switching device responsive to an input voltage $V_A$ is powered by (1) a low internal supply voltage $V_L$ provided on a supply line coupled to a supply terminal for receiving an external supply voltage $V_{LL}$ and (2) a high internal supply voltage $V_H$ provided on a supply line coupled to a supply terminal for receiving an external supply voltage $V_{HH}$ that exceeds $V_{LL}$ by a largely constant amount, the device changing state as $V_A$-$V_L$ passes a threshold voltage $V_T$ such that, with $V_T$ substantially at a value $V_S$ and with $V_L$ and $V_H$ substantially at $V_{LL}$ and $V_{HH}$, respectively, the device switches (1) from a first state to a second state as $V_A$ rises above $V_{LL}$+$V_S$ and (2) from the second state to the first state as $V_A$ drops below $V_{LL}$+$V_S$, characterized by dynamic hysteresis means for performing at least one of (1) after $V_A$ rises above $V_{LL}$+$V_S$, temporarily decreasing $V_T$ below that which would be present in the absence of the means and (2) after $V_A$ drops below $V_{LL}$+$V_S$ temporarily increasing $V_T$ above that which would be present in the absence of the means.

2. A circuit as in claim 1 characterized in that $V_T$ returns to $V_S$ before $V_A$ starts moving in a direction opposite to the direction in which $V_A$ was moving when $V_T$ changed.

3. A circuit as in claim 1 wherein the device comprises a pair of input N-channel and P-channel field-effect transistors (FET's) having respective gates responsive to $V_A$, respective sources coupled respectively to the $V_L$ and $V_H$ supply lines and respective drains coupled together to provide an output voltage $V_B$ inverse to $V_A$, characterized in that the means controls $V_T$ in response to $V_B$.

4. A circuit as in claim 3 in which there are a pair of output N-channel and P-channel FET's having respective gates responsive to a voltage derived from at least $V_B$, respective sources coupled respectively to the $V_L$ and $V_H$ supply lines, and respective drains coupled together, the circuit being part of an integrated circuit having externally accessible terminals comprising an input terminal coupled to the gate of at least one of the input FET's, an output terminal coupled to the drains of the output FET's, and the supply terminals, characterized in that the means substantially prevents current flowing through the output terminal due to a change in $V_B$ resulting from a change in $V_A$ from causing $V_B$ to change again.

5. An electronic circuit as in claim 1 wherein the device comprises first and second input conduction channels of opposite conductivity type, the first channel is coupled between the $V_L$ supply line and a node, the second channel is coupled between the $V_H$ supply line and the node, and each of the input channels turns on when the other turns off and vice versa, characterized in that the hysteresis means comprises:

at least one further conduction channel, each associated with one of the input channels, being of the same conductivity type as the associated input channel, and coupled between the node and the particular supply line coupled to the associated input channel; and control means for causing each further channel to turn on temporarily when its associated input channel turns on.

6. A circuit as in claim 5 wherein each input channel is part of an input field-effect transistor (FET) having a gate electrode responsive to $V_A$, characterized in that each further channel is part of a further FET having a gate electrode responsive to a threshold-control voltage that controls the conduction of that further channel.

7. A circuit as in claim 6 wherein the node provides a voltage $V_B$ inverse to $V_A$, characterized in that the control means comprises:

an inverter for providing a voltage $V_E$ inverse to $V_B$; and charging/discharging means responsive to $V_E$ for generating each threshold-control voltage.

8. An electronic circuit in which a switching device powered by a low supply voltage $V_L$ and a high supply voltage $V_H$ comprises a pair of input enhancement-mode N-channel and P-channel field-effect transistors (FET's) having respective gates responsive to an input voltage $V_A$, respective sources respectively coupled to respective supply lines at voltages $V_L$ and $V_H$, and respective drains coupled together to provide an output voltage $V_B$ inverse to $V_A$, $V_B$ changing in value as $V_A$-$V_L$ passes a threshold voltage $V_T$ such that, with $V_T$ substantially at a value $V_S$ and with $V_L$ and $V_H$ at respective values $V_{LL}$ and $V_{HH}$, $V_B$ switches (1) from a high voltage level to a low voltage level as $V_A$ rises above $V_{LL}+V_S$ and (2) from the low level to the high level as $V_A$ drops below $V_{LL}+V_S$, characterized by dynamic hysteresis means for (1) after $V_A$ rises above $V_{LL}+V_S$, temporarily decreasing $V_T$ below that which would be present in the absence of the hysteresis means and (2) after $V_A$ drops below $V_{LL}+V_S$, temporarily increasing $V_T$ above that which would be present in the absence of the hysteresis means.

9. A circuit as in claim 8 characterized in that the hysteresis means comprises:

a pair of further enhancement-mode N-channel and P-channel FET's having respective gates, respective sources coupled respectively to the $V_L$ and $V_H$ supply lines, and respective drains coupled to the drains of the input FET's; and control means for (1) causing the further N-channel FET to turn on temporarily in response to $V_B$ going from the high level to the low level and (2) for causing the further P-channel FET to turn on temporarily in response to $V_B$ going from the low level to the high level.

10. A circuit as in claim 9 characterized in that the control means provides (1) a first threshold-control voltage to the gate of the further N-channel FET and (2) a second threshold-control voltage to the gate of the further P-channel FET.

11. A circuit as in claim 8 characterized in that the hysteresis means comprises:

a pair of further enhancement-mode N-channel and P-channel FET's having respective gates, respective sources coupled respectively to the $V_L$ and $V_H$ supply lines, and respective drains coupled to the drains of the input FET's; and control means (1) responsive to $V_B$ going from the high level to the low level for charging the gate of the further N-channel FET to voltage sufficient to turn it on and later discharging the gate of the further N-channel FET to turn it off and (2) responsive to $V_B$ going from the low level to the high level for charging the gate of the further P-channel FET to voltage sufficient to turn it on and later discharging the gate of the further P-channel FET to turn it off.

12. A circuit as in claim 11 characterized in that the control means comprises:

a pair of charge-supply enhancement-mode N-channel and P-channel FET's having respective gates responsive to $V_B$, respective sources coupled respectively to the $V_L$ and $V_H$ supply lines, and respective drains coupled together for providing a voltage $V_E$ inverse to $V_B$;

first and second charging elements coupled to the drains of the charge-supply FET's for providing charge respectively to the gates of the further N-channel and P-channel FET's;

a first discharge element for providing a discharge path from the gate of the further N-channel FET to the $V_L$ supply line; and a second discharge element for providing a discharge path from the gate of the further P-channel FET to the $V_H$ supply line.

13. A circuit as in claim 12 characterized in that (1) the first charging element temporarily provides charge to the gate of the further N-channel FET at a faster rate than that at which charge flows through the first discharge element to the $V_L$ supply line and (2) the second charging element temporarily provides charge to the gate of the further P-channel FET at a faster rate than that at which charge flows through the second discharge element to the $V_H$ supply line.

14. A circuit as in claim 13 characterized in that each charging element is a capacitive element.

15. A circuit as in claim 12 characterized in that the control means (1) activates the first charging element to charge the gate of the further N-channel FET before activating the first discharge element to discharge the gate of the further N-channel FET and (2) activates the second charging element to charge the gate of the further P-channel FET before activating the second discharge element to discharge the gate of the further P-channel FET.

16. A circuit as in claim 12 characterized in that:

the first charging element comprises a first inverter for producing a voltage $V_F$ inverse to $V_E$, a second inverter for producing a voltage $V_G$ inverse to $V_F$, and a pair of enhancement-mode N-channel and P-channel FET's having respective gates respectively responsive to $V_F$ and $V_G$, respective first source/drain elements coupled to the drains of the charge-supply FET's, and respective second source-drain elements coupled to the gate of the further N-channel FET; and the second charging element comprises the first inverter, the second inverter, and a pair of enhancement-mode N-channel and P-channel FET's having respective gates respectively responsive to $V_G$ and $V_F$, respective first source/drain elements coupled to the drains of the charge-supply FET's, and respective second source-drain elements coupled to the gate of the further P-channel FET.

17. A circuit as in claim 16 characterized in that;

the first discharge element comprises an N-channel FET having a gate responsive to $V_G$, a source coupled to the $V_L$ supply line, and a drain coupled to the gate of the further N-channel FET; and the second discharge element comprises a P-channel FET having a gate responsive to $V_G$, a source coupled to the $V_H$ supply line, and a drain coupled to the gate of the further P-channel FET.

18. A circuit as in claim 11 in which there are a pair of output enhancement-mode N-channel and P-channel FET's having gates responsive to a voltage derived from at least $V_B$, respective sources coupled respectively to the $V_L$ and $V_H$ supply lines, and respective drains coupled together, characterized in that the FET's and the hysteresis means are part of an integrated circuit having externally accessible terminals comprising an input terminal coupled to the gate of at least one of the input FET's, an output terminal coupled to the drains of the output FET's, and a pair of supply terminals respectively coupled to the $V_L$ and $V_H$ supply lines.

19. A circuit as in claim 18 characterized in that the hysteresis means substantially inhibits current flowing through the output terminal due to a change in $V_B$ resulting from a change in $V_A$ from causing $V_B$ to change again.

20. An electronic circuit in which a switching device powered by a low supply voltage $V_L$ and a high supply voltage $V_H$ comprises a pair of input N-channel and P-channel field-effect transistors (FET's) having respective gates responsive to an input voltage $V_A$, respective sources respectively coupled to respective supply lines at voltages $V_L$ and $V_H$, and respective drains coupled together to provide an output voltage $V_B$ inverse to $V_A$, $V_B$ switching (1) from a high voltage level to a low voltage level as $V_A-V_L$ rises above a threshold voltage $V_T$ and (2) from the low level to the high level as $V_A-V_L$ drops below $V_T$, characterized by dynamic hysteresis means comprising:

a pair of further N-channel and P-channel FET's having respective gates, respective sources coupled respectively to the $V_L$ and $V_H$ supply lines, and respective drains coupled to the drains of the input FET's; and control means for (1) causing the further N-channel FET to turn on temporarily in response to $V_B$ going from the high level to the low level and (2) for causing the further P-channel FET to turn on temporarily in response to $V_B$ going from the low level to the high level.

* * * * *